US009640565B2

United States Patent
Tian et al.

(10) Patent No.: US 9,640,565 B2
(45) Date of Patent: May 2, 2017

(54) GOA UNIT, METHOD FOR MANUFACTURING GOA UNIT, DISPLAY SUBSTRATE AND DISPLAY DEVICE

(71) Applicant: BOE TECHNOLOGY GROUP CO., LTD., Beijing (CN)

(72) Inventors: Yunyun Tian, Beijing (CN); Hyunsic Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/154,311

(22) Filed: May 13, 2016

(65) Prior Publication Data

US 2016/0358949 A1 Dec. 8, 2016

(30) Foreign Application Priority Data

Jun. 4, 2015 (CN) .......................... 2015 1 0302983

(51) Int. Cl.
| | |
|---|---|
| *H01L 27/12* | (2006.01) |
| *H01L 49/02* | (2006.01) |
| *G02F 1/1368* | (2006.01) |
| *G02F 1/1362* | (2006.01) |

(52) U.S. Cl.
CPC ........ *H01L 27/1255* (2013.01); *G02F 1/1368* (2013.01); *G02F 1/136227* (2013.01); *H01L 27/124* (2013.01); *H01L 27/1288* (2013.01); *H01L 28/60* (2013.01)

(58) Field of Classification Search
None
See application file for complete search history.

(56) References Cited

U.S. PATENT DOCUMENTS

2008/0079000 A1* 4/2008 Chung .............. G02F 1/136213
257/59
2009/0200544 A1* 8/2009 Lee ..................... H01L 51/5215
257/40

\* cited by examiner

*Primary Examiner* — Sue A Purvis
*Assistant Examiner* — Aaron Dehne
(74) *Attorney, Agent, or Firm* — Harness, Dickey & Pierce, P.L.C.

(57) ABSTRACT

The present disclosure provides a Gate driver On Array (GOA) unit, a method for manufacturing the GOA unit, a display substrate and a display device. The GOA unit includes a capacitor structure including: a first metal layer arranged on a substrate; an insulation layer arranged on the first metal layer, wherein the insulation layer is thinned out and has a first thickness, and the first thickness is less than a thickness of any other layer arranged on a same layer as the insulation layer in the display substrate; and a second metal layer arranged on the insulation layer.

17 Claims, 3 Drawing Sheets

US 9,640,565 B2

GOA UNIT, METHOD FOR MANUFACTURING GOA UNIT, DISPLAY SUBSTRATE AND DISPLAY DEVICE

CROSS REFERENCE OF RELATED APPLICATION

The present application claims a priority of the Chinese patent application No. 201510302983.9 filed on Jun. 4, 2015, which is incorporated herein by reference in its entirety.

TECHNICAL FIELD

The present disclosure relates to the field of display technology, in particular to a Gate driver On Array (GOA) unit, a method for manufacturing the GOA unit, a display substrate and a display device.

BACKGROUND

With development of Thin Film Transistor Liquid Crystal Display (TFT-LCD) technology and industry technological progress, a cost for manufacturing a TFT-LCD is reduced and a process for manufacturing the TFT-LCD is improved, so that the TFT-LCD has taken the place of a Cathode Ray Tube (CRT) display and became a mainstream technology in the field of flat panel display.

Currently, for the TFT-LCD, there is a trend of integrating peripheral ICs onto a glass substrate, so as to omit the peripheral ICs and arrange a driving circuit directly on the glass substrate. In related art, a gate driving signal is outputted to a gate electrode on the glass substrate by ICs on a peripheral flexible circuit board, which is connected to the glass substrate by a hot-pressing process after the glass substrate is formed. However, in the GOA technique, the flexible circuit board is omitted and the driving circuit may be arranged directly on the glass substrate. As a result, both the cost and a size of a bezel of the display are reduced.

A conventional GOA circuit may include a capacitor C and a plurality of TFTs. There are a variety of different GOA circuit which is not further elaborated herein in the related art, each GOA circuit includes a capacitor C.

The capacitor C typically includes a first metal layer, an insulation layer and a second metal layer that are arranged sequentially, wherein the first metal layer is parallel to the second metal layer, and a portion of the first metal layer is opposite to a corresponding portion of the second metal layer, so as to form the capacitor.

As the display with a narrow bezel is becoming popular, a display with a narrower bezel is desired. Thus, a size of the GOA circuit is desired to be minimized, so as to reduce a non-display area and obtain the display with the narrower bezel. However, widths of TFTs in the variety of GOA circuits are difficult to be reduced due to requirements of various loads. Furthermore, the capacitor is required to suppress noise of a signal outputted from the gate electrode and lower voltage level at a pull up node, which limits the size of the capacitor to some extent. Thus, in order to form the capacitor, both the area of the whole first metal layer and the area of the whole second metal layer are large, and the insulation layer is further arranged between the first metal layer and the second metal layer that are parallel to each other to form the capacitor. As a result, the width of the GOA circuit is limited, and thus it is difficult to obtain a flat panel display with a narrower bezel.

SUMMARY

An object of the present disclosure is to provide a GOA unit, a method for manufacturing the GOA unit, a display substrate and a display device, so as to obtain the flat panel display with the narrower bezel.

The solutions of the present disclosure are as follows.

In one aspect, the present disclosure provides in some embodiments a GOA unit arranged in a display substrate, wherein the GOA unit includes a capacitor structure, the capacitor structure includes: a first metal layer arranged on the display substrate; an insulation layer arranged on the first metal layer, wherein the insulation layer is thinned out and has a first thickness, and the first thickness is less than a thickness of any other layer arranged on a same layer as the insulation layer in the display substrate; and a second metal layer arranged on the insulation layer.

Alternatively, the capacitor structure further includes: a passivation layer arranged on the second metal layer; and a connection electrode layer arranged on the passivation layer, wherein the connection electrode layer connects the second metal layer and a gate line of the display substrate, and the second metal layer is electrically connected to the connection electrode layer through a via hole formed in the passivation layer.

Alternatively, the connection electrode layer is electrically connected to a common electrode.

Alternatively, the first metal layer and a gate metal layer of the display substrate are arranged on a same layer; the insulation layer and a gate insulation layer of the display substrate are arranged on a same layer; and the second metal layer and a pixel electrode layer of the display substrate are arranged on a same layer.

Alternatively, the first thickness is determined based on a capacitance value of the capacitor or based on areas of the first metal layer and the second metal layer.

Alternatively, the first thickness is half of a thickness of the gate insulation layer.

In another aspect, the present disclosure provides in some embodiments a method for manufacturing a GOA unit arranged in a display substrate, wherein the GOA unit includes a capacitor structure, and the method includes steps of: forming a pattern of a first metal layer at a position where the capacitor is arranged in the display substrate; forming a pattern of an insulation layer on the first metal layer, wherein the insulation layer is thinned out and has a first thickness, and the first thickness is less than a thickness of any other layer arranged on a same layer as the insulation layer in the display substrate; and forming a pattern of a second metal layer on the insulation layer.

Alternatively, the step of forming the pattern of the first metal layer includes a step of: forming a pattern of a gate electrode layer including a gate electrode of a Thin Film Transistor (TFT) structure and the first metal layer of the capacitor structure.

Alternatively, the step of forming the pattern of the insulation layer on the first metal layer includes a step of: forming a pattern of a first insulation layer including a gate insulation layer of a TFT structure and the insulation layer of the capacitor structure.

Alternatively, after the step of forming the pattern of the first insulation layer, the method further includes steps of: forming a pattern of an active layer; and forming a pattern of a source-drain metal layer, and thinning the insulation layer out.

Alternatively, during a process of forming the pattern of the source-drain electrode layer in the display substrate, thinning the insulation layer out by a mask for manufacturing the pattern of the source-drain electrode layer.

Alternatively, after the step of forming the pattern of the source-drain metal layer, the method further includes steps of: forming a pattern of a second insulation layer; forming a pattern of a pixel electrode layer; forming a pattern of a passivation layer; and forming a pattern of a connection electrode.

Alternatively, the method further includes steps of: after depositing a film for forming the pattern of the second insulation layer, etching off a portion of the second insulation layer corresponding to the capacitor structure; and forming a first via hole in the second insulation layer corresponding to a position of the source-drain metal layer, so as to enable a pixel electrode to be formed at a later time to be electrically connected to the source-drain metal layer through the first via hole.

Alternatively, the method further includes a step of: forming a second via hole in the passivation layer, so as to enable the connection electrode to be electrically connected to the pixel electrode through the second via hole, and enable the pixel electrode to be electrically connected to a gate line.

Alternatively, the first thickness is half of a thickness of a gate insulation layer arranged on a same layer as the insulation layer in the display substrate.

Alternatively, the method further includes: forming a pattern of a passivation layer on the second metal layer; and forming a pattern of a connection electrode layer on the passivation layer, wherein the connection electrode layer connects the second metal layer and a gate line of the display substrate, and the second metal layer is electrically connected to the connection electrode layer through a via hole formed in the passivation layer.

In yet another aspect, the present disclosure further provides in some embodiments a display substrate including the above GOA unit.

In yet another aspect, the present disclosure further provides in some embodiments a display device including the above display substrate.

As can be seen from above, the present disclosure provides the GOA unit, the method for manufacturing the GOA unit, the display substrate and the display device. The GOA unit includes a capacitor structure, the capacitor structure includes a first metal layer arranged on a substrate; an insulation layer arranged on the first metal layer, wherein the insulation layer is thinned out and has a first thickness, and the first thickness is less than a thickness of any other layer arranged on a same layer as the insulation layer in the display substrate; and a second metal layer arranged on the insulation layer. As a result, it enables to obtain such a capacitor structure of the GOA circuit in which the insulation layer arranged between the two metal layers functioning as two electrodes of the capacitor is of a small thickness and the areas of the two metal layers are reduced, while the capacitance value of the capacitor is unaffected. Therefore, the area of the GOA circuit may be reduced, and the flat panel display with the narrower bezel may be obtained.

DETAILED DESCRIPTION

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides a GOA unit which is arranged in a display substrate and includes a region for a TFT structure 10, a region for a capacitor structure 20 and etc.

Figure 1:
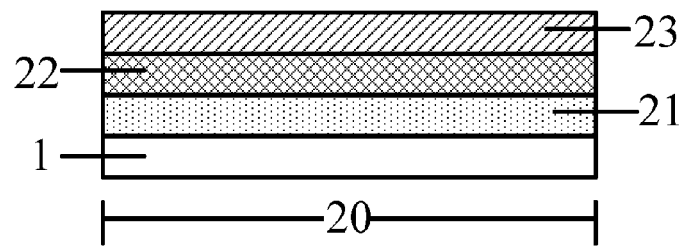
FIG. 1 is a schematic view showing a GOA unit according to at least one embodiment of the present disclosure.

As shown in FIG. 1, the capacitor structure 20 may include a first metal layer 21 formed on a substrate 1; an insulation layer 22 arranged on the first metal layer 21, wherein the insulation layer 22 is thinned out and has a first thickness, and the first thickness is less than a thickness of any other layer arranged on a same layer as the insulation layer 22 in the display substrate; and a second metal layer 23 arranged on the insulation layer 22.

In related art, in the process of manufacturing the GOA unit, the insulation layer 22 of the capacitor structure 20 is typically formed simultaneously with a layer of the TFT structure 10, e.g. a gate insulation layer 12, so as to simply the manufacturing process. Furthermore, the layer of the TFT structure 10 has to be up to a certain thickness, so as to ensure that the layer of the TFT structure 10 functions properly (for example, the gate insulation layer 11 functions for insulation properly); however, such arrangement causes that the insulation layer 22 formed simultaneously with the layer of the TFT structure 10 is also of a large thickness, and thus dielectric loss between the two metal layers is increased. Therefore, the areas of the two metal layers has to be enlarged to maintain the capacitance value of the capacitor, thereby the area of the GOA circuit is difficult to be reduced.

In contrast, in the embodiment of the present disclosure, the insulation layer 22 (i.e. the insulation medium) between the two electrodes (i.e. the first metal layer 21 and the second metal layer 23) of the capacitor is thinned out and thus has a small thickness, so that the areas of the two metal layers may be reduced while the capacitance value of the capacitor in the GOA circuit is unaffected. Accordingly, a length and/or a width of the GOA circuit may be reduced, so that the area of the GOA circuit is reduced, thereby the flat panel display with the narrower bezel may be obtained.

The insulation layer 22 may be thinned out during a period of forming the insulation layer 22 (i.e. the gate insulation layer 12); alternatively, the insulation layer 22 may be thinned out by etching the insulation layer 22 with an etching liquid before the second metal layer 23 is formed; alternatively, after the insulation layer 22 is formed, the insulation layer 22 may be thinned out by a mask for an active layer 13 and the source-drain metal layer 15 of the TFT structure 10 in a half tone process during a period of forming the active layer 13 and/or the source-drain metal layer 14. As a matter of fact, the insulation layer 22 may be thinned out by any proper method in related art at a proper time during the process of manufacturing the GOA unit.

The thickness of the insulation layer 22 having been thinned out may be determined based on the desired capacitance value of the capacitor in the GOA unit, and the areas (widths) of the first metal layer 21 and the second metal layer 23 that are determined based on actual demand. In an embodiment, the thickness of the insulation layer 22 may be half of a thickness of a layer (e.g. the gate insulation layer 12) that is formed simultaneously with the insulation layer 22.

The first metal layer 21 and the gate metal layer 11 of the TFT structure may be formed simultaneously and arranged on a same layer.

In particular, the second metal layer 23 may be a pixel electrode of the TFT structure, i.e. the second metal layer 23 may be a portion of the pixel electrode.

Figure 2:
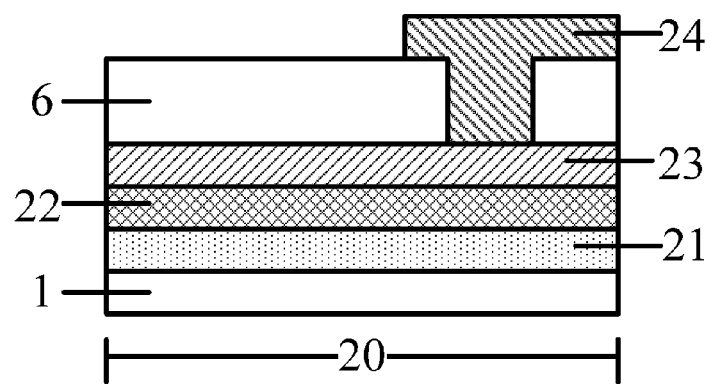
FIG. 2 is another schematic view showing a GOA unit according to at least one embodiment of the present disclosure.

As shown in FIG. 2, a passivation layer 6 may be further arranged at a region of the capacitor structure 20 in the GOA unit, and a connection electrode 24 is arranged on the passivation layer 6, wherein the second metal layer 23 is electrically connected to the connection electrode 24 through a via hole 61 formed in the passivation layer 6, so as to enable the pixel electrode 23 to be electrically connected to a gate line (not shown).

As the connection electrode 24 is connected to the second metal layer 23, the connection electrode 24 may be regarded as a portion of the second metal layer 23, and functions as one electrode of the capacitor.

Figure 6:
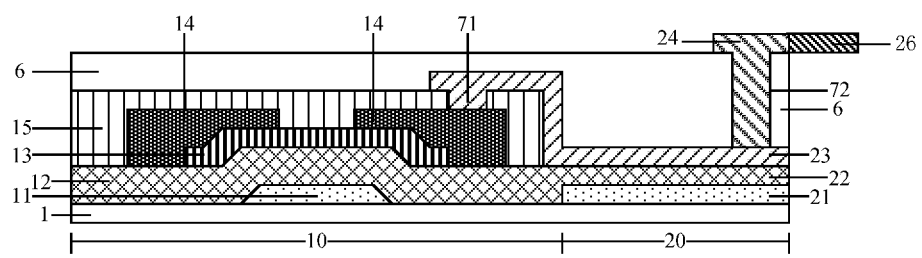
FIG. 6 is yet another schematic view showing a GOA unit according to at least one embodiment of the present disclosure.

In addition, the connection electrode 24 may be further electrically connected to a common electrode 26 (FIG. 6) which is also arranged on the passivation layer 6, i.e. the connection electrode 24 may be regarded as a portion of the common electrode 26.

Figure 3:
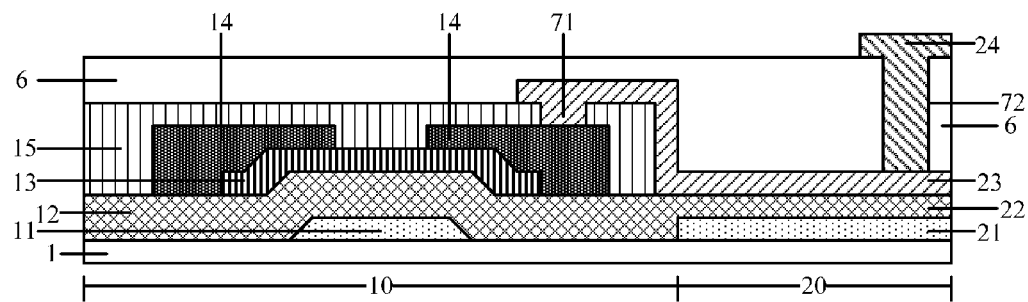
FIG. 3 is yet another schematic view showing a GOA unit according to at least one embodiment of the present disclosure.

FIG. 3 is a schematic view showing a GOA unit according to an embodiment of the present disclosure. It should be appreciated that the TFT structure 10 as shown in FIG. 3 is merely an example, and TFT structure 10 of the present disclosure is not limited thereto.

In yet another aspect, the present disclosure further provides in some embodiments a method for manufacturing the above GOA unit.

Figure 4:
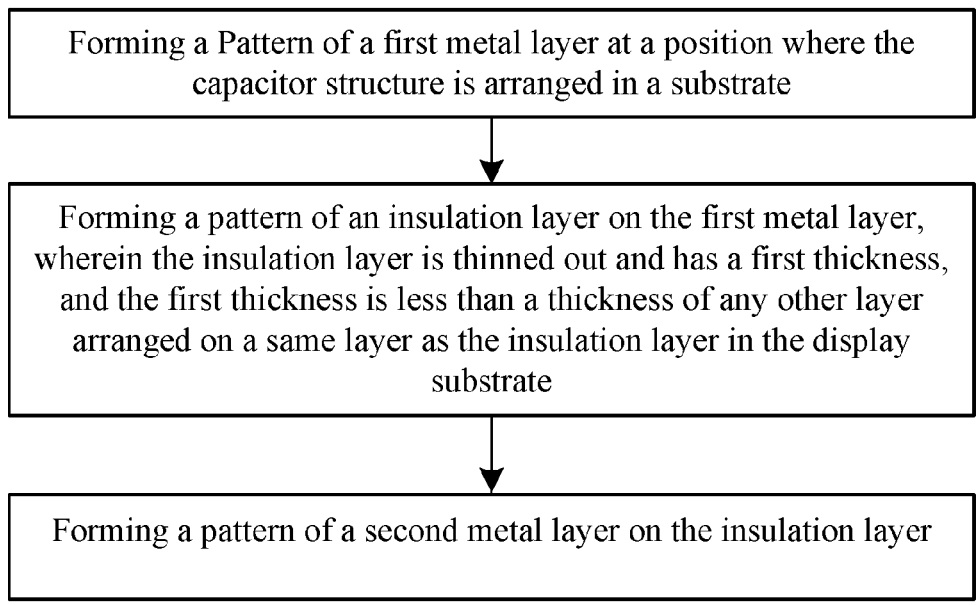
FIG. 4 is a flow diagram showing a method for manufacturing the GOA unit according to at least one embodiment of the present disclosure.

As shown in FIG. 4, the method includes steps of: forming a first metal layer 21 at a position where the capacitor structure 20 is arranged in the substrate 1; forming an insulation layer 22 on the first metal layer 21, wherein the insulation layer 22 is thinned out and has a first thickness, and the first thickness is less than a thickness of any other layer arranged on a same layer as the insulation layer 22 in the display substrate; and forming a second metal layer 23 on the insulation layer 22.

Figure 5:
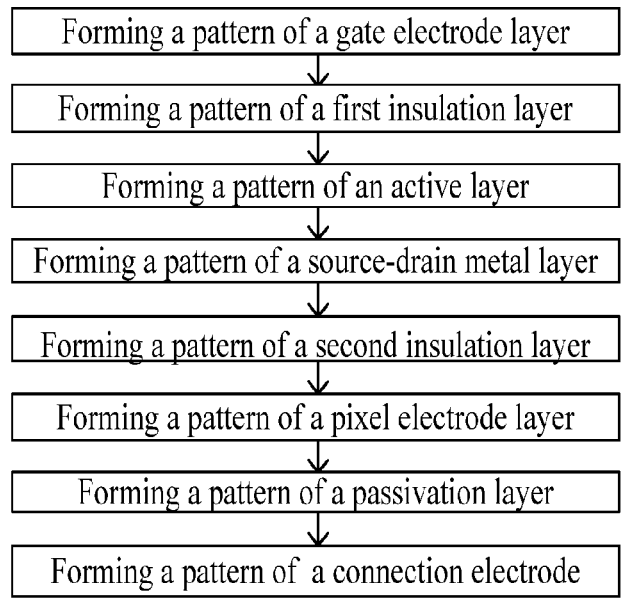
FIG. 5 is a flow diagram showing a method for manufacturing the GOA unit as shown in FIG. 3.

FIG. 5 illustrates a method for manufacturing the GOA unit as shown in FIG. 3, which includes the following steps.

1. Forming a pattern of a gate electrode layer including a gate electrode 11 of a TFT structure and the first metal layer 21 of the capacitor structure.

In the embodiment, the layers may be formed by any proper process in the related art, such as depositing a film, exposing by a mask, etching and peeling.

2. Forming a pattern of a first insulation layer including a gate insulation layer 12 of a TFT structure 10 and the insulation layer 22 of the capacitor structure 20.

In another embodiment, the above steps 1 and 2 may be combined into one step, i.e. a pattern of the gate electrode layer and the first insulation layer may be formed in a one-time manufacturing process, which is not further elaborated herein.

3. Forming a pattern of an active layer 13.

4. Forming a pattern of a source-drain metal layer 14, and thinning the insulation layer 22 out.

In the above step 4, the insulation layer 22 may be exposed and etched by a mask for the source-drain metal layer 14 in a half tone process, so as to thin the insulation layer 22 out.

Due to protection of the mask, a portion of the gate insulation layer 12 beneath the source-drain metal layer 14 fully remains after the etching process. Moreover, although the mask does not cover a region of a channel, a further portion of the gate insulation layer 12 corresponding to the channel also fully remains because the active layer 14 at the region of the channel is made of silicon oxide. In other words, except that the portion of the gate insulation layer 12 corresponding to the source and drain electrodes and the portion of the gate insulation layer 12 corresponding to the channel fully remain, a thickness of other portion of the insulation layer 22 of the capacitor structure 20 (i.e. the first insulation layer) is reduced after being etched, e.g. half of the thickness of the insulation layer 22 is reduced. However, as the thickness of the portion of the gate insulation layer 12 corresponding to the channel remains unchanged, properties of the TFT may not be affected by the above etching process; otherwise, when the thickness of the portion of the gate insulation layer 12 corresponding to the channel becomes smaller, a current Ioff of the TFT may be increased, so that the TFT may not function properly as a switch. As the thickness of the portion of the gate insulation layer 12 corresponding to the TFT structure 10 remains unchanged, parameters such as a load of the display panel, and a gate-source capacitor Cgs and a gate-drain capacitor Cgd of the TFT are not affected.

5. Forming a pattern of a second insulation layer 15.

It should be appreciated that, a portion of the second insulation layer 15 corresponding to the capacitor structure should be etched off after a film for forming the second insulation layer is deposited. Moreover, a first via hole 71 is formed in the second insulation layer 15 corresponding to a position of the source-drain metal layer 14, so as to enable a pixel electrode 23 to be formed subsequently to be electrically connected to the source-drain metal layer 14 through the first via hole.

6. Forming a pattern of a pixel electrode 23.

7. Forming a pattern of the passivation layer 6.

A second via hole 72 is formed in a portion of the passivation layer 6 corresponding to the pixel electrode 23.

8. Forming a pattern of a connection electrode 24.

Figure 7:
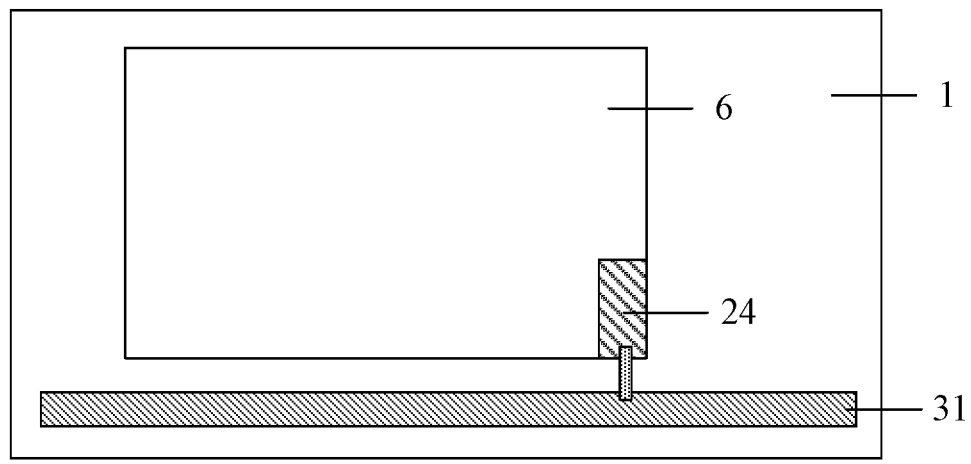
FIG. 7 is a plan view of the GOA unit illustrated in FIG. 6.

The connection electrode 24 is electrically connected to the pixel electrode 23 through the second via hole 72, so as to electrically connect the pixel electrode 23 and a gate line 31 (FIG. 7).

In the GOA unit manufactured by the above method according to the embodiments of the present disclosure, the portion of the insulation layer 22 corresponding to the capacitor structure 10 is of a small thickness, thereby the areas of the two metal layers (i.e. two electrodes of the capacitor) are reduced, while the capacitance value of the capacitor is unaffected. Therefore, the flat panel display with the narrower bezel may be obtained.

In yet another aspect, the present disclosure further provides in some embodiments a display substrate including the above GOA unit.

In yet another aspect, the present disclosure further provides in some embodiments a display device including the above display substrate.

The preferred embodiments of the present disclosure have been discussed. It is appreciated that many modifications and polishes may be made to the present disclosure without departing from the principle of the present disclosure for those skilled in the art. These modifications and polishes should also be deemed to be fallen within the scope of the present disclosure.

What is claimed is:

1. A Gate driver On Array (GOA) unit arranged in a display substrate, wherein the GOA unit comprises a capacitor structure, the capacitor structure comprises:
    a first metal layer arranged on the display substrate;
    an insulation layer arranged on the first metal layer, wherein the insulation layer is thinned out and has a first thickness, and the first thickness is less than a thickness of any other layer arranged on a same layer as the insulation layer in the display substrate; and
    a second metal layer arranged on the insulation layer;
    a passivation layer arranged on the second metal layer; and
    a connection electrode layer arranged on the passivation layer, wherein the connection electrode layer connects the second metal layer and a gate line of the display substrate, and the second metal layer is electrically connected to the connection electrode layer through a via hole formed in the passivation layer.

2. The GOA unit according to claim 1, wherein the connection electrode layer is electrically connected to a common electrode.

3. The GOA unit according to claim 1, wherein the first metal layer and a gate metal layer of the display substrate are arranged on a same layer;
    the insulation layer and a gate insulation layer of the display substrate are arranged on a same layer; and
    the second metal layer and a pixel electrode layer of the display substrate are arranged on a same layer.

4. The GOA unit according to claim 3, wherein the first thickness is determined based on a capacitance value of the capacitor or based on areas of the first metal layer and the second metal layer.

5. The GOA unit according to claim 3, wherein the first thickness is half of a thickness of the gate insulation layer.

6. A method for manufacturing a Gate driver On Array (GOA) unit arranged in a display substrate, wherein the GOA unit comprises a capacitor structure, and the method comprises steps of:
    forming a pattern of a first metal layer at a position where the capacitor structure is arranged in the display substrate;
    forming a pattern of an insulation layer on the first metal layer, wherein the insulation layer is thinned out and has a first thickness, and the first thickness is less than a thickness of any other layer arranged on a same layer as the insulation layer in the display substrate; and
    forming a pattern of a second metal layer on the insulation layer;
    forming a pattern of a passivation layer on the second metal layer; and
    forming a pattern of a connection electrode layer on the passivation layer, wherein the connection electrode layer connects the second metal layer and a gate line of the display substrate, and the second metal layer is electrically connected to the connection electrode layer through a via hole formed in the passivation layer.

7. The method according to claim 6, wherein the step of forming the pattern of the first metal layer comprises a step of:
    forming a pattern of a gate electrode layer comprising a gate electrode of a Thin Film Transistor (TFT) structure and the first metal layer of the capacitor structure.

8. The method according to claim 6, wherein the step of forming the pattern of the insulation layer on the first metal layer comprises a step of:
    forming a pattern of a first insulation layer comprising a gate insulation layer of a Thin Film Transistor (TFT) structure and the insulation layer of the capacitor structure.

9. The method according to claim 8, wherein after the step of forming the pattern of the first insulation layer, the method further comprises steps of:
    forming a pattern of an active layer; and
    forming a pattern of a source-drain metal layer, and thinning the insulation layer out.

10. The method according to claim 9, wherein
    during a process of forming the pattern of the source-drain electrode layer in the display substrate, thinning the insulation layer out by a mask for manufacturing the pattern of the source-drain electrode layer.

11. The method according to claim 9, wherein after the step of forming the pattern of the source-drain metal layer, the method further comprises steps of:
    forming a pattern of a second insulation layer; and
    forming a pattern of a pixel electrode layer.

12. The method according to claim 11, further comprises steps of: after depositing a film for forming the pattern of the second insulation layer, etching off a portion of the second insulation layer corresponding to the capacitor structure; and forming a via hole in the second insulation layer corresponding to a position of the source-drain metal layer, so as to enable a pixel electrode to be electrically connected to the source-drain metal layer through the via hole.

13. The method according to claim 12, wherein the via hole formed in the passivation layer enables the connection electrode to be electrically connected to the pixel electrode, and enables the pixel electrode to be electrically connected to a gate line.

14. The method according to claim 6, wherein during a process of forming the pattern of the source-drain electrode layer in the display substrate, thinning the insulation layer out by a mask for manufacturing the pattern of the source-drain electrode layer.

15. The method according to claim 6, wherein the first thickness is half of a thickness of a gate insulation layer arranged on a same layer as the insulation layer in the display substrate.

16. A display substrate comprising the GOA unit according to claim 1.

17. A display device comprising the display substrate according to claim 16.

* * * * *